United States Patent
Sawada et al.

(10) Patent No.: US 8,829,456 B2
(45) Date of Patent: Sep. 9, 2014

(54) RADIATION IMAGING APPARATUS, RADIATION IMAGING SYSTEM, AND METHOD FOR MANUFACTURING RADIATION IMAGING APPARATUS

(75) Inventors: Satoru Sawada, Kodama-gun (JP); Masato Inoue, Kumagaya (JP); Shinichi Takeda, Honjo (JP); Takamasa Ishii, Honjo (JP); Taiki Takei, Okegawa (JP); Masayoshi Akiyama, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 289 days.

(21) Appl. No.: 13/324,037

(22) Filed: Dec. 13, 2011

(65) Prior Publication Data

US 2012/0181434 A1    Jul. 19, 2012

(30) Foreign Application Priority Data

Jan. 13, 2011  (JP) ................................. 2011-004650

(51) Int. Cl.
*G01T 1/20* (2006.01)
*H01L 31/0232* (2014.01)

(52) U.S. Cl.
CPC ......... *G01T 1/2002* (2013.01); *H01L 31/02322* (2013.01); *G01T 1/2018* (2013.01)
USPC ............ 250/370.11; 250/361 R; 250/366; 250/338.4

(58) Field of Classification Search
CPC ............ H01L 31/02322; G01T 1/2002; G01T 1/2018
USPC ........ 250/370.01–370.15, 366, 361 R, 338.4; 438/48, 57; 257/428, E31.129
See application file for complete search history.

(56) References Cited

U.S. PATENT DOCUMENTS 5,956,382 A * 9/1999 Wiener-Avnear et al. ... 378/98.8
7,105,830 B2 * 9/2006 Nagano et al. ........... 250/370.11
(Continued)

FOREIGN PATENT DOCUMENTS

CN  101002110 A   7/2007
CN  101689556 A   3/2010
(Continued)

OTHER PUBLICATIONS

Saint-Gobain Crystals, "YAG(Ce) Yttrium Aluminum Garnet Scintillation Material," published 2004, Retrieved from internet [Nov. 25, 2013]; Retrieved from url <www.detectors.saint-gobain.com/uploadedFiles/SGdetectors/Documents/Product_Data_Sheets/YAG-Data-Sheet.pdf>.*

(Continued)

*Primary Examiner* — David Porta
*Assistant Examiner* — Yara B Green
(74) *Attorney, Agent, or Firm* — Canon USA, Inc. IP Divison (57) ABSTRACT

A radiation imaging apparatus includes a substrate, at least one imaging element, a scintillator, a first heat peelable adhesive member which fixes the substrate to the imaging element, and a second heat peelable adhesive member which fixes the imaging element to the scintillator. An adhesive strength of the first heat peelable member is decreased by heat. A temperature of the first heat peelable adhesive member at which the adhesive strength is decreased is substantially equal to a temperature at which second heat peelable adhesive member fixes the imaging element to the scintillator. A heat transfer quantity per unit time of the substrate is different from that of the scintillator.

10 Claims, 8 Drawing Sheets

(56) References Cited

U.S. PATENT DOCUMENTS

| | | |
|---|---|---|
| 2002/0038851 A1 | 4/2002 | Kajiwara et al. |
| 2006/0276007 A1* | 12/2006 | Nakata et al. ............ 438/455 |
| 2008/0261336 A1* | 10/2008 | Saito et al. ............... 438/15 |
| 2010/0021668 A1 | 1/2010 | Shimokawa |

FOREIGN PATENT DOCUMENTS

| | | |
|---|---|---|
| EP | 2273286 A2 | 1/2011 |
| JP | 06-184504 * | 7/1994 |
| WO | 2008/072462 A1 | 6/2008 |
| WO | 2010103917 A1 | 9/2010 |

OTHER PUBLICATIONS

Corning, Corning Eagle XG AMLCD Glass Substrates Material Information, published 2006, Retrieved from internet [Nov. 25, 2013]; Retireved from url <psec.uchicago.edu/glass/Corning_Eagle_XGdisplayglass.pdf>.*

Machine Translation JP 06/184504.*

\* cited by examiner

RADIATION IMAGING APPARATUS, RADIATION IMAGING SYSTEM, AND METHOD FOR MANUFACTURING RADIATION IMAGING APPARATUS

BACKGROUND OF THE INVENTION

1. Field of the Invention

The present invention relates to a radiation imaging apparatus detecting radiation, such as X-rays, a radiation imaging system, and a method for manufacturing a radiation imaging apparatus, and more particularly relates to a radiation imaging apparatus used for a medical diagnostic imaging apparatus, a nondestructive inspection apparatus, an analysis apparatus, and the like.

2. Description of the Related Art

A single crystal semiconductor wafer which is generally commercially available is small as compared to a glass substrate. Therefore, in order to form a large-area radiation imaging apparatus using a single crystal semiconductor wafer, single crystal semiconductor wafers in each of which detection elements are formed are divided to form a plurality of imaging element chips, and a certain number of imaging element chips are arranged to have a desired area.

US Patent Application No. 2002/0038851 has disclosed that in order to reduce cost, before chip-shaped imaging elements are adhered to a base board which forms a part of an apparatus, inspection of the imaging elements and replacement of an imaging element having a defect discovered thereby are performed. In addition, it has been disclosed that after the inspection and the replacement are performed, the imaging elements are fixed to the base board by adhesion. Furthermore, it has also been disclosed that a scintillator which converts radiation into light having a wavelength band detectable by the imaging elements is arranged by adhesion on the imaging elements at a side opposite to the base board (substrate).

International Publication No. WO 2008/072462 has disclosed that in order to perform rework of a liquid crystal display device, a double-sided adhesive sheet which includes at least one heat peelable adhesive layer containing thermally expandable particles is used to fix a liquid crystal display module unit and a backlight unit.

However, according to the method disclosed in US Patent Application No. 2002/0038851, after the imaging elements are adhered to the base board or after the imaging elements and the scintillator are adhered to each other, it is difficult to replace an imaging element or a scintillator which is detected as a defective by the inspection. For example, in a radiation detection apparatus including a plurality of imaging elements, when an imaging element having a defect is peeled away from a base board, an imaging element having no defect may be cracked by an external force applied thereto. In addition, properties of an imaging element having no defect may be degraded in some cases by a solvent used for dissolving an adhesive. Furthermore, the case will be considered in which in an inspection step performed after imaging elements are adhered to a base board, no defects are detected in the imaging elements, but some defect is detected in an inspection step performed after a scintillator is adhered to the imaging elements. In this case, since it is believed that only the scintillator has a defect, the scintillator must be peeled away from the imaging elements and be replaced; however, the base board is not necessarily peeled away from the imaging elements. As described above, in a radiation imaging apparatus having a laminate structure in which imaging elements are provided between a scintillator and a substrate, it may be preferable in some cases that peeling between the scintillator and the imaging elements and peeling between the substrate and the imaging elements are not simultaneously performed. When the peeling between the scintillator and the imaging elements and the peeling between the substrate and the imaging elements are simultaneously performed, the imaging elements are placed in a mechanically unstable state so as to be fixed to nothing; hence, the imaging elements may collide with something while moving during the peeling and may be cracked in some cases.

In addition, in the liquid crystal display device disclosed in International Publication No. WO 2008/072462 in which one liquid crystal display module unit and one backlight unit are fixed to each other, the peeling is simply performed just between the liquid crystal display module unit and the backlight unit. That is, peeling performed in a multilayered structure including at least three layers is not taken into consideration.

SUMMARY OF THE INVENTION

In consideration of the problems described above, as for a radiation imaging apparatus in which at least one imaging element is provided between a scintillator and a substrate, the present invention provides a radiation imaging apparatus in which at least one imaging element or a scintillator can be peeled away while the imaging element is placed in a mechanically stable state.

Accordingly, a radiation imaging apparatus of the present invention comprises: a substrate; at least one imaging element; a scintillator; at least one first heat peelable adhesive member which fixes the substrate to the imaging element, an adhesive strength of the heat peelable adhesive member can be decreased by heat; and a second heat peelable adhesive member fixes the imaging element to the scintillator. A temperature of the first heat peelable adhesive member at which the adhesive strength is decreased is substantially equal to a temperature of the second heat peelable adhesive member at which the imaging element is fixed to the scintillator. The heat transfer quantity per unit time of the substrate is different from the heat transfer quantity per unit time of the scintillator.

In addition, a radiation imaging system of the present invention comprises the radiation imaging apparatus described above and a signal processing devise which processes a signal from the radiation imaging apparatus.

Furthermore, a method for manufacturing a radiation imaging apparatus according to the present invention comprises the steps of: fixing an imaging element to a substrate with a first heat peelable adhesive member having an adhesive strength which is decreased by heating and to a scintillator having a different heat transfer quantity per unit time from that of the substrate with a second heat peelable adhesive member having the same temperature as that of the first heat peelable adhesive member at which the adhesive strength is decreased; and inspecting the imaging element fixed to the substrate. When the imaging element or the scintillator is judged as a defective by inspection in the inspection step, the method further comprises the step of heating the first heat peelable adhesive member through the substrate and the second heat peelable adhesive member through the scintillator so as to perform peeling between the imaging element and one of the substrate and the scintillator, whichever has a larger heat transfer quantity per unit time, and so as not to perform peeling between the imaging element and the other one of the substrate and the scintillator.

According to the present invention, in a radiation imaging apparatus having a laminate structure in which at least one imaging element is provided between a scintillator and a substrate, peeling between the imaging element and the scintillator and peeling between the imaging element and the substrate can be separately performed. Hence, in a radiation imaging apparatus having a laminate structure in which at least one imaging element is provided between a scintillator and a substrate, a radiation imaging apparatus can be obtained in which the imaging element or the scintillator can be peeled away while the imaging element is placed in a mechanically stable state.

Further features of the present invention will become apparent from the following description of exemplary embodiments with reference to the attached drawings.

DESCRIPTION OF THE EMBODIMENTS

Hereinafter, embodiments of the present invention will be described with reference to the drawings. In the present invention, besides beams, such as α rays, β rays, and γ rays, formed of particles (including photons) emitted by radioactive decay, radiation includes beams, such as X-rays, particle rays, and cosmic rays, having energy equivalent to or more than that of the rays mentioned above. In addition, in the present invention, light includes visible light and infrared rays.

First Embodiment

Figure 1A:
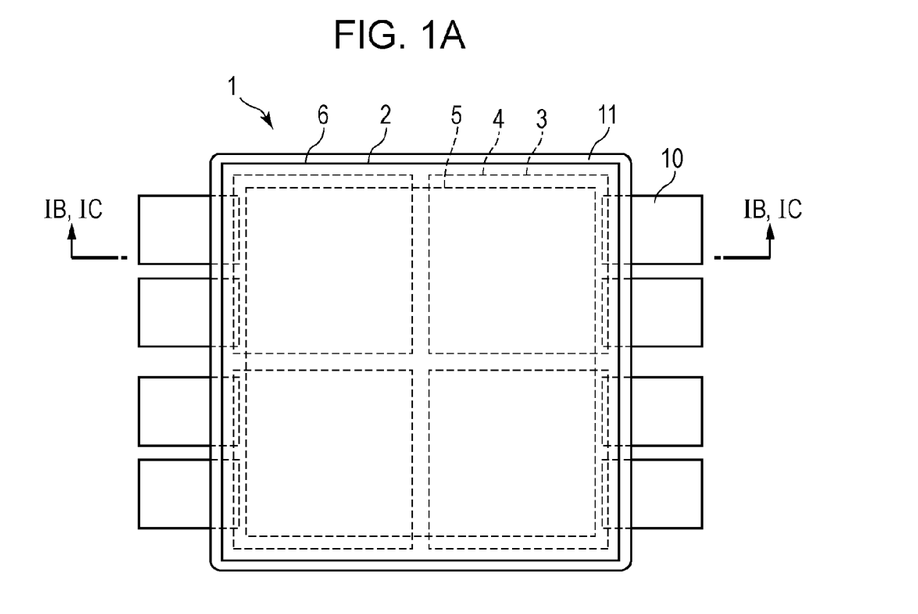
FIG. 1A is a plan view of a radiation imaging apparatus according to a first embodiment of the present invention.
Figure 1B:
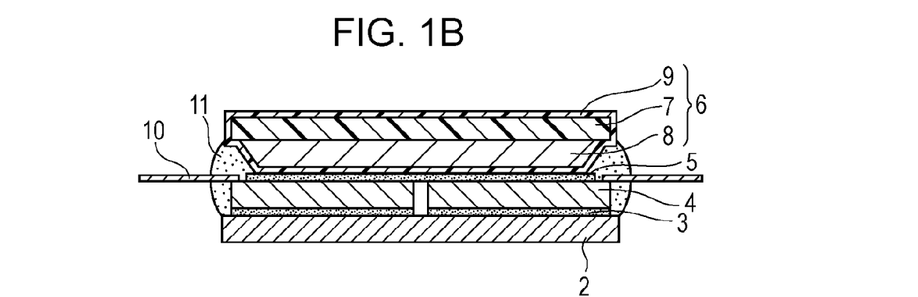
FIG. 1B is a cross-sectional view of the radiation imaging apparatus taken along the line IB-IB of FIG. 1A.
Figure 1C:
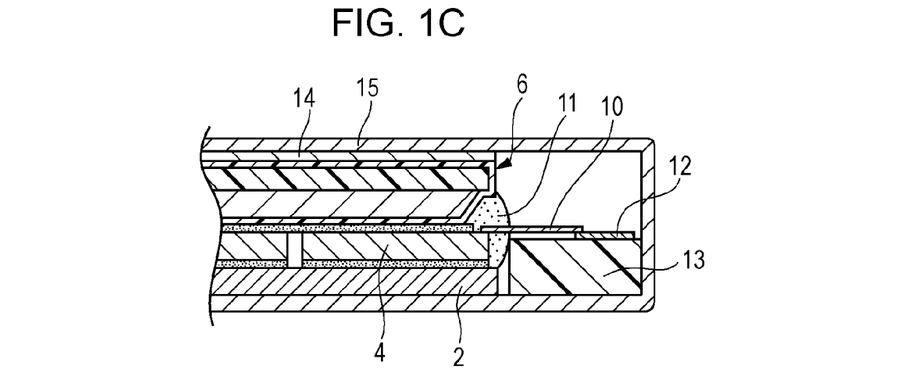
FIG. 1C is a partially enlarged cross-sectional view of the radiation imaging apparatus taken along the line IC-IC of FIG. 1A.

With reference to FIGS. 1A to 1C, a first embodiment of the present invention will be described. FIG. 1A is a plan view showing primary constituent elements of a radiation imaging apparatus according to the first embodiment of the present invention, FIG. 1B is a cross-sectional view of the radiation imaging apparatus taken along the line IB-IB of FIG. 1A, and FIG. 1C is a partially enlarged cross-sectional view of the radiation imaging apparatus taken along the line IC-IC of FIG. 1A.

As shown in FIGS. 1A and 1B, a radiation imaging apparatus 1 has a substrate 2, four imaging elements 4 fixed thereon with a first heat peelable adhesive member 3 provided therebetween, and a scintillator 6 fixed on the imaging elements 4 with a second heat peelable adhesive member 5 provided therebetween. Wiring boards 10 transferring signals between the imaging elements and at least one external circuit (not shown) are fixed to the imaging elements 4. In order to reduce electrical and mechanical influences generated when the imaging elements 4 come into contact with each other, the four imaging elements 4 are arranged on the substrate 2 with spaces interposed therebetween. In addition, the number of imaging elements 4 fixed on the substrate 2 is not limited to four, and at least one imaging element 4 may be arranged. The imaging element 4 has a plurality of pixels each having a switching element and a sensor portion. For example, there may be mentioned a CMOS sensor, a CCD sensor, a PIN type or an MIS type sensor using amorphous silicon (hereinafter simply referred to as "a-Si"), an a-Si sensor having pixels each formed of a TFT, and an SOI (Silicon on insulator) sensor. Although a flexible printed circuit board (FPC) is preferably used for the wiring board 10, a rigid wiring board may also be used. The scintillator 6 has at least a scintillator layer 8 converting radiation, such as X-rays, into light which can be detected by the imaging element 4. As shown in FIG. 1B, the scintillator 6 preferably further has a substrate 7 supporting the scintillator layer 8 and a protective layer 9 protecting the scintillator layer 8 from moisture and an impact from the outside. For the substrate 7, for example, amorphous carbon (a-C) (heat conductivity: 5 to 8 (W/(m·k))), aluminum (Al) (heat conductivity: 237 (W/(m·k))), or a resin (heat conductivity: 0.1 to 0.2 (W/(m·k))) may be used. For the scintillator layer 8, for example, there may be used a columnar crystal, such as CsI: Tl (heat conductivity of CsI: 1 (W/(m·k))), and a particulate crystal, such as GOS, each of which converts radiation, such as X-rays, into light which can be detected by the imaging element 4. For the protective layer 9, for example, a polyparaxylylene and a hot melt resin may be used. For the substrate 2, Al (heat conductivity: 237 (W/(m·k))) may be used. However, besides Al, for example, a glass (heat conductivity: 1 (W/(m·k))), a resin (heat conductivity: 0.2 (W/(m·k))), such as an acrylic resin, various ceramics (heat conductivity: 3 to 170 (W/(m·k))), and a metal (heat conductivity: 15 to 427 (W/(m·k))) may also be used. In addition, the first heat peelable adhesive member 3, the second heat peelable adhesive member 5, the scintillator 6, and the substrate 2 will be described later in details.

In addition, as shown in FIG. 1C, in order to suppress the intrusion of moisture and the like from the outside, along the periphery of the radiation imaging apparatus 1, a sealing member 11 is arranged between the substrate 2 and the scintillator 6. Accordingly, the imaging elements 4 are sealed by the sealing member 11 thus provided, and the wiring boards 10 are arranged so as to penetrate the sealing member 11. In this structure, an acrylic resin, an epoxy resin, a silicone resin, and the like may be used for the sealing member 11, and the resins mentioned above are each preferably a black resin which absorbs light. The reason for this is that when light having a wavelength detectable by the imaging element 4 passes through the substrate 2, this light is prevented from being incident on the imaging element 4 as stray light, and the degradation in image quality is suppressed. The radiation imaging apparatus 1 according to this embodiment includes an integrated circuit 12 which processes signals outputted from the imaging elements 4 through the wiring boards 10. In addition, the radiation imaging apparatus 1 further includes a housing 15 which accommodates the substrate 2, the imaging elements 4, the scintillator 6, and the integrated circuit 12. A buffer member 13 is arranged between the sealing member 11 and the housing 15, and a buffer member 14 is arranged between the scintillator 6 and the housing 15. As the buffer member 13, for example, a black resin which absorbs light having a wavelength band detectable by the imaging element 4 is preferably used. Accordingly, stray light in the housing 15 can be suppressed from being incident on the imaging element 4, and as a result, the degradation in image quality can be suppressed.

This heat peelable adhesive member is formed of an adhesive and a foaming agent containing thermally expandable particles. The first heat peelable adhesive member 3 is arranged to fix the substrate 2 to the imaging elements 4, to enable the substrate 2 to be peeled away from the imaging elements 4 in a repair work, and to easily replace at least one of the imaging elements 4. The second heat peelable adhesive member 5 is arranged to fix the imaging elements 4 to the scintillator 6, to enable the scintillator 6 to be peeled away from the imaging elements 4 in a repair work, and to easily replace at least one of the imaging elements 4 or the scintillator. The first heat peelable adhesive member 3 and the second heat peelable adhesive member 5 are each a thermal reaction type member and each have an adhesive strength which is decreased through a reaction caused by heat at a predetermined temperature or more. In addition, the first heat peelable adhesive member 3 and the second heat peelable adhesive member 5 have the same temperature at which the adhesive strength is decreased.

In the first heat peelable adhesive member 3 and the second heat peelable adhesive member 5, the thermally expandable particles contained therein as a foaming agent are foamed and/or expanded by heating, irregularities are formed on the surface of the heat peelable adhesive member, and an adhesive area with the adherend is decreased, so that the adhesive properties are degraded. Therefore, the imaging elements 4 can be safely peeled away from the scintillator 6 and the substrate 2. In this embodiment, the thickness of the heat peelable adhesive member and the size of the thermally expandable particles are appropriately determined so that the mechanism described above can be fully utilized.

As the adhesives, appropriate adhesives, such as a rubber adhesive, an acrylic adhesive, a styrene/conjugated diene block copolymer adhesive, and a silicone adhesive, may be used, and an ultraviolet curable adhesive may also be used. In addition, the adhesive may further contain appropriate additives, such as a crosslinking agent, a tackifier, a plasticizer, a filler, and an antiaging agent, if needed. In more particular, for example, there may be mentioned rubber adhesives using a natural rubber and various synthetic rubbers as a base polymer and acrylic adhesives using acrylic polymers as a base polymer. The above acrylic adhesives contain as a component, acrylic alkyl esters of an acrylic acid or a methacrylic acid, which include an alkyl group generally having 20 carbon atoms or less, such as a methyl group, an ethyl group, a propyl group, a butyl group, a 2-ethylhexyl group, an isooctyl group, an isononyl group, an isodecyl group, a dodecyl group, a lauryl group, a tridecyl group, a pentadecyl group, a hexadecyl group, a heptadecyl group, an octadecyl group, a nonadecyl group, and an eicosyl group; esters of an acrylic acid or a methacrylic acid, which have a function-containing group, such as a hydroxyethyl group, a hydroxypropyl group, and a glycidyl group; acrylic acid, methacrylic acid, itaconic acid, N-methylolacrylamide, acrylonitrile, methacrylonitrile, vinyl acetate, styrene, isoprene, butadiene, isobutylene, and a vinyl ether. The adhesives are appropriately selected and used in accordance with the purpose of use, such as the adhesive strength to an adherend, and the heat peelable adhesive member expandable by heating can be formed by blending a foaming agent with the adhesive.

As the foaming agent, various types of materials capable of achieving the above purpose may be used. Accordingly, for example, a foaming agent is used which is foamed and/or expanded at a higher temperature than an adhesion treatment temperature of the adhesive. As an example of a usable foaming agent, decomposition type inorganic foaming agents, such as ammonium carbonate, ammonium hydrogencarbonate, sodium hydrogencarbonate, ammonium nitrite, sodium borohydride, and azides, may be mentioned. In addition, organic foaming agents, such as an azo compound, may also be used. For example, there may be mentioned alkane fluorides, such as trichloromonofluoromethane and dichloromonofluoromethane; azo compounds, such as azobisisobutyronitrile, azodicarbonamide, and barium azodicarboxylate; hydrazine compounds, such as p-toluenesulfonyl hydrazide, diphenylsulfone-3,3'-disulfonylhydrazide, 4,4'-oxybis(benzenesulfonyl hydrazide) and allylbis(sulfonyl hydrazide); semicarbazide compounds, such as p-toluoylenesulfonyl semicarbazide and 4,4'-oxybis(benzenesulphonyl semicarbazide); triazole compounds, such as 5-morphoryl-1,2,3,4-thiatriazole; N-nitroso compounds, such as N,N'-dinitrosopentamethylenetetramine and N,N'-dimethyl-N,N'-dinitrosoterephthalamide; and other compounds having a low boiling point.

Furthermore, as the foaming agent, there may be used thermally expandable particles in which an appropriate substance, such as isobutane, propane, or pentane, easily gasified to show a thermally expandable property is contained in a shell-forming material by a coacervation method or an interface polymerization method. The average particle diameter of the thermally expandable particles to be used is generally 5 to 50 μm. However, thermally expandable particles having a finer average particle diameter may also be used. The particle diameter of the thermally expandable particles of the present invention is represented by one of a test sieve opening size measured by a screening method, a Stokes equivalent diameter by a precipitation method, an equivalent circular diameter by a microscopic method, an equivalent spherical diameter by a light scattering method, and an equivalent spherical value by an electrical resistance test method. In addition, the average particle diameter of the thermally expandable particles of the present invention is a median diameter using the particle diameter described above.

As the shell-forming material forming the thermally expandable particles, for example, a vinylidene chloride-acrylonitrile copolymer, a polyvinyl alcohol, a polyvinyl butyral, a polymethylmethacrylate, a polyacrylonitrile, a polyvinylidene chloride, and a polysulfone, may be mentioned. However, as the shell-forming material of the present invention, for example, a material which has hot melting properties and is decreased in thickness by expansion of a thermally expandable substance and a material which is destroyed by thermal expansion may also be used.

In addition, since the imaging element 4 must detect light emitted from the scintillator 6, the second heat peelable adhesive member 5 has optical transparency. When light emitted from the scintillator 6 is visible light, the transmittance thereof must be high and is particularly preferably 90% or more at a wavelength at which the maximum emission amount of the scintillator layer 8 is shown. In addition, since the degree of sharpness (modulation transfer function: MTF) showing the clearness of an image is decreased as the thickness of the second heat peelable adhesive member 5 is increased, the thickness thereof is preferably 200 μm or less, more preferably 50 μm or less, and even more preferably smaller than a pixel pitch. However, since the adhesive strength is also required, a thickness of 1 to 50 μm is practically preferable. In addition, the average particle diameter of the thermally expandable particles contained in the second heat peelable adhesive member 5 is preferably smaller than a pixel pitch P. If the average particle diameter of the thermally expandable particles is smaller than the pixel pitch P of the imaging element 4, light scattered by the thermally expandable particles is not widely spread. Therefore, a decrease in the degree of sharpness (MTF) of an image to be obtained can be suppressed. In the imaging element 4, a plurality of pixels each containing a photoelectric transducer and a switching element are arranged in matrix, and a pitch at which the pixels are arranged is the pixel pitch P.

Figure 2A:
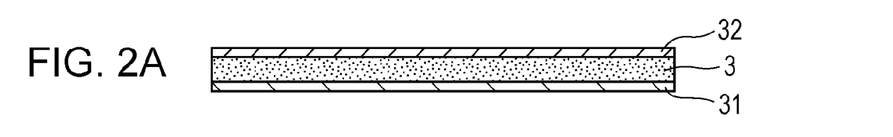
FIG. 2A is a cross-sectional view illustrating one example of a heat peelable adhesive member of the present invention.
Figure 2B:
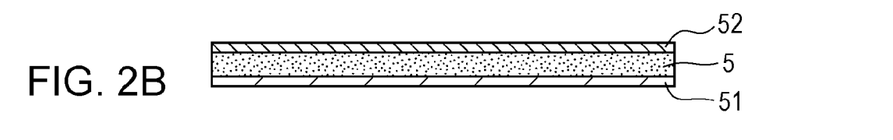
FIG. 2B is a cross-sectional view illustrating one example of another heat peelable adhesive member of the present invention.

FIGS. 2A and 2B are cross-sectional views of the first and the second heat peelable adhesive members before use, respectively. As shown in FIG. 2A, the surfaces of the first heat peelable adhesive member 3 are covered with separators 31 and 32, and the separators 31 and 32 are peeled away when the first heat peelable adhesive member 3 is used. As in the case described above, the surfaces of the second heat peelable adhesive member 5 are covered with separators 51 and 52 as shown in FIG. 2B, and the separators 51 and 52 are peeled away when the second heat peelable adhesive member 5 is used.

Figure 2C:
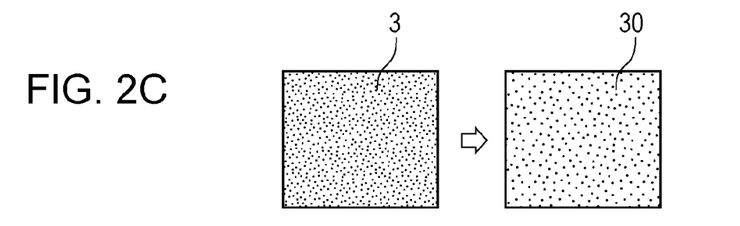
FIG. 2C is a plan view illustrating the heat peelable adhesive member of the present invention.

Next, the mechanism of decreasing the adhesive strength of the heat peelable adhesive member of the present invention by heating will be described with reference to FIG. 2C. In this case, a heat peelable adhesive member using thermally expandable particles will be described by way of example, the left side of FIG. 2C is a plan view of the heat peelable adhesive member before heating, and the right side is a plan view of the heat peelable adhesive member after heating. Compared to the surface of the first heat peelable adhesive member 3 before heating, on the surface thereof after heating, many large irregularities are generated, and as a result, a heat peelable adhesive member 30 having a decreased adhesive strength is formed. In addition, the second heat peelable adhesive member 5 is also the same as that described above.

Figure 2D:
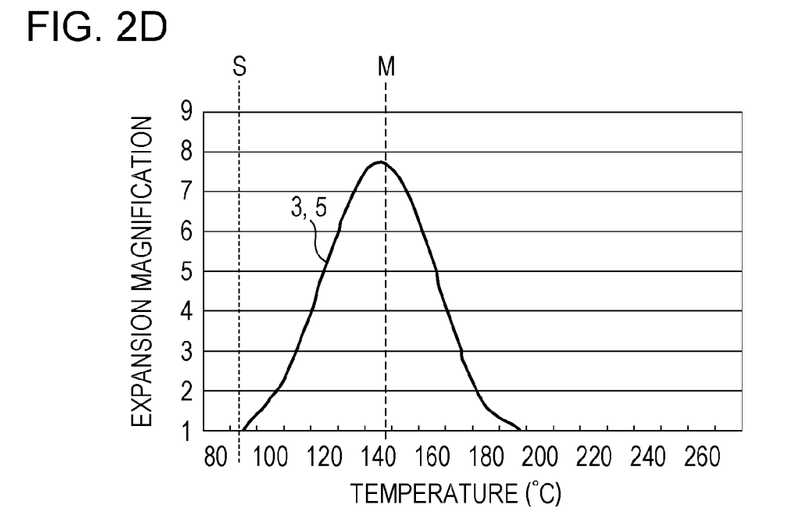
FIG. 2D is a graph showing a temperature-expansion magnification relationship of the heat peelable adhesive member of the present invention.

Next, an expansion magnification property of the thermally expandable particles contained in the first and the second heat peelable adhesive members with respect to the temperature will be described with reference to FIG. 2D. In FIG. 2D, S indicates a temperature (expansion start temperature) at which volume expansion of the thermally expandable particles starts, and M indicates a temperature (maximum expansion temperature) at which the volume of the thermally expandable particles is maximized. That is, the thermally expandable particles of the first heat peelable adhesive member 3 have the same expansion start temperature and/or the maximum expansion temperature as that of the thermally expandable particles of the second heat peelable adhesive member 5. However, even if containing no thermally expandable particles as the foaming agent, heat peelable adhesive members may be used when the expansion start temperatures of the foaming agents are the same, and when the materials thereof and the compositions of the adhesives are the same. That is, the first heat peelable adhesion member 3 and the second heat peelable adhesion member 5 of the present invention have the same temperature at which the adhesive strength is decreased. As a typical example, the mechanism in which the adhesion strength of a heat peelable adhesive member containing thermally expandable particles is decreased by heating will be described.

When the thermally expandable particles are being heated, first, the shell-forming material starts to soften, the substance which is contained therein and is easily gasified simultaneously starts to foam, and the internal pressure is increased, so that the particles are placed in a state ready to be expanded. The temperature at this stage is the expansion start temperature S. When the volume is maximized by expansion, the internal pressure balances with the tension of the shell-forming material and the external pressure, and the expanded state is maintained. The temperature at this stage is the maximum expansion temperature M. If heating is further continued, the tension of the shell-forming material and the external pressure exceed the internal pressure since a gas generated by foaming diffuses through the shell-forming material which is decreased in thickness, and hence contraction occurs. By using the thermally expandable particles as described above for the heat peelable adhesive member, the thermally expandable particles in the adhesive are expanded by heating, and as described with reference to FIG. 2D, the irregularities are formed on the surface to decrease the adhesion area to the adherend, so that the adhesive properties are degraded.

In addition, the first heat peelable adhesive member 3 has the same temperature as that of the second heat peelable adhesive member 5 at which the adhesive strength is decreased by heating. The temperatures at which the adhesive strength is decreased are the same temperature indicate that in a state in which the same force is applied to a subject to be peeled away in the same direction, a temperature at which the subject is peeled away from the adherend in the case of the first heat peelable adhesive member 3 is the same as that in the case of the second heat peelable adhesive member 5. For example, in a peeling test method in accordance with Japanese Industrial Standard JIS Z0237, it is indicated that a temperature at which a subject is peeled away from an adherend in the case of the first heat peelable adhesive member 3 is the same as that in the case of the second heat peelable adhesive member 5. In addition, the temperature at which the adhesive strength is decreased by heating of the first heat peelable adhesive member 3 and that of the second heat peelable adhesive member 5 are preferably not more than a temperature at which the properties of the scintillator 6 are changed. The temperature at which the properties of the scintillator 6 are changed is the lowest temperature among the activation temperature of the scintillator layer 8, the glass transition point of the substrate 7, and the glass transition point of the protective layer 9.

In the present invention, the heat transfer quantity per unit time of the scintillator 6 in contact with the second heat peelable adhesive member and that of the substrate 2 in contact with the first heat peelable adhesive member are important. The heat transfer quantity per unit time indicates the heat quantity transferred per unit time. When the heat conductivity is represented by k (J/s·m·k), the temperature difference between two surfaces of the member is represented by ΔT (K), the thickness of the member is represented by L (m), the contact area with a member to which heat is transferred is represented by S (m²), and the heating time is represented by t (s), heat quality Qt (J) is shown by the following formula.

$$Qt = k \times S \times \Delta T \times t / L \qquad \text{Formula (1)}$$

In this formula, since the temperature difference ΔT between the two surfaces of the substrate 2 as the subject can be assumed equal to that between the two surfaces of the scintillator 6 as the subject, and the heating times can also be assumed equal to each other, the heat transfer quantity Q per unit time is shown by the following formula.

$$Q = k \times S / L \qquad \text{Formula (2)}$$

Hence, when areas of the members forming the scintillator 6 and the substrate 2 in contact with each other are assumed approximately equal to each other, the heat transfer quantity per unit time of each member can be specified by a value obtained by dividing the heat conductivity of each member by the thickness thereof.

For example, as the substrate 7, when a-C having a heat conductivity of 5 (W/(m·k)) and a thickness of 1 mm is used, the heat transfer quantity per unit time of the substrate 7 is 5,000 (J). As in the case described above, as the scintillator layer 8, when CsI: Tl having a thickness of 0.55 mm is used, the heat transfer quantity per unit time of the scintillator layer is 1,818 (J). In addition, as the protective layer 9, when a polyparaxylylene having a thickness of 0.0024 mm is used, since there is a portion in contact with the substrate 7 and a portion in contact with the scintillator layer 8, the thickness is 0.0048 mm in total, and the heat transfer quantity per unit time of the protective layer 9 is 4,167 (J). Therefore, the heat transfer quantity per unit time of the whole scintillator 6 is 10,985 (J).

On the other hand, for example, when Al having a thickness of 2 mm is used as the substrate 2, the heat transfer quantity per unit time of the substrate 2 is 118,500 (J). That is, the heat transfer quantity per unit time of the scintillator 6 is remarkably different from the heat transfer quantity per unit time of the substrate 2, such as approximately ¹/₁₀ or less.

In addition, for example, when a glass having a thickness of 2 mm is used as the substrate 2, the heat transfer quantity of per unit time of the substrate 2 is 500 (J). That is, the heat transfer quantity per unit time of the scintillator 6 is remarkably different from the heat transfer quantity per unit time of the substrate 2, such as 10 times or more.

In the case as described above, when heating is simultaneously performed from a substrate 2 side and a scintillator 6 side in a temperature-constant bath, the heat quantity transferred to the first heat peelable adhesive member 3 becomes significantly different from the heat quantity transferred to the second heat peelable adhesive member 5. If there is a remarkable different in heat quantity thus transferred, the timing at which the adhesive strength is decreased so that peeling can be performed is different between the first heat peelable adhesive member 3 and the second heat peelable adhesive member 5, which have the same temperature at which the adhesive strength is decreased by heating. Therefore, the peeling between the scintillator 6 and the imaging elements 4 and the peeling between the substrate 2 and the imaging elements 4 are separately performed. Accordingly, even in the state in which the imaging elements 4 are peeled away from one of the substrate 2 and the scintillator 6, since being fixed to the other one of the substrate 2 and the scintillator 6, at least one imaging element 4 can be replaced while the imaging elements 4 are placed in a mechanically stable state. Hence, the imaging elements are not placed in a mechanically unstable state in which the imaging elements are not fixed during the peeling. Accordingly, since being not moved during a peeling operation, the imaging elements are not brought into contact with something and are prevented from being mechanically destroyed. This configuration is particularly preferable when a plurality of imaging elements 4 is provided. In addition, when only the scintillator 6 has a defect, it becomes possible to peel away only the scintillator 6 without peeling the substrate 2 from the imaging elements 4. Hence, in the radiation imaging apparatus in which the imaging elements 4 are provided between the scintillator 6 and the substrate 2, the imaging elements 4 or the scintillator 6 can be peeled away in the state in which the imaging elements 4 are mechanically stable.

Next, a peeling process for peeling the imaging elements 4 according to the present invention will be described. Hereinafter, the case in which a-C (heat transfer quantity per unit time: 5,000 (J)) is used for the substrate 7, and Al (heat transfer quantity per unit time: 118,500 (J)) is used for the substrate 2 will be described. In this embodiment, as the first and the second heat peelable adhesive members, "Revalpha No. 3193MS" (trade name, manufactured by NITTO DENKO CORP) is used.

First, a radiation imaging apparatus containing an imaging element 4 which is necessarily peeled away is heated in a temperature-constant bath. In the temperature-constant bath, forces equivalent to each other are applied respectively to the scintillator 6 and the substrate 2 perpendicular to the imaging element 4 in a direction apart therefrom. The substrate 2 formed of Al has a heat transfer quantity per unit time larger than that of the scintillator 6 having the substrate 7 formed of a-C, heat is transferred to the first heat peelable adhesive member 3 through the substrate 2, the expansion starts at the expansion start temperature S shown in FIG. 2D, and the adhesive strength of the first heat peelable adhesive member 3 starts to decrease. Heat is further applied to the first heat peelable adhesive member 3, and the first heat peelable adhesive member 3 reaches the maximum expansion temperature M at which the adhesive strength thereof is most decreased. The adhesive strength of the first heat peelable adhesive member 3 is decreased at a temperature higher than the expansion start temperature S, and by the force applied to the substrate 2, peeling between the substrate 2 and the imaging elements 4 is performed. In this case, when the heat transfer quantity per unit time of the substrate 2 is assumed to be 1, the heat transfer quantity per unit time of the scintillator 6 is preferably ¹/₁₀ or less. In this case, although heat is also transferred to the second heat peelable adhesive member 5 through the scintillator 6, the heat transfer quantity per unit time of the scintillator 6 is small as compared to the heat transfer quantity per unit time of the substrate 2. Therefore, when the first heat peelable adhesive member 3 reaches the expansion start temperature S or the maximum expansion temperature M, the second heat peelable adhesive member 5 does not reach the expansion start temperature S or the maximum expansion temperature M, respectively. Accordingly, the adhesive strength of the second heat peelable adhesive member 5 is not so much decreased as compared to that of the first heat peelable adhesive member 3, and no peeling between the scintillator 6 and the imaging elements 4 is performed.

Subsequently, in the state in which the scintillator 6, the second heat peelable adhesive member 5, and the imaging elements 4 are laminated, the second heat peelable adhesive member 5 is heated. At this stage, while the imaging elements 4 are each adsorbed by a transport device 21 at a surface opposite to the scintillator 6, heating may be performed from the surface of the substrate 7 with a hot plate or the like. In addition, when a temperature-constant bath is used, heating may be performed after the temperature is once returned to room temperature, or heating may be continuously performed from the previous heating. Heat is transferred to the second heat peelable adhesive member 5 through the scintillator 6, expansion starts at the expansion start temperature S shown in FIG. 2D, and the adhesive strength of the second heat peelable adhesive member 5 starts to decrease. Heat is further applied to the second heat peelable adhesive member 5, and the second heat peelable adhesive member 5 reaches the maximum expansion temperature M at which the adhesive strength is most decreased. The adhesive strength of the second heat peelable adhesive member 5 is decreased at a temperature higher than the expansion start temperature S, and by the force applied to the scintillator 6, peeling between the scintillator 6 and the imaging elements 4 is performed.

As described above, in the present invention, by using the first heat peelable adhesive member 3 and the second heat peelable adhesive member, which have the same temperature at which the adhesive strength is decreased, the substrate 2 and the scintillator 6 having a heat transfer quantity per unit time different from that thereof are adhered to the imaging elements 4. Therefore, the timing at which the surface of the substrate 2 at a first heat peelable adhesive member 3 side reaches the temperature at which the adhesive strength of the first heat peelable adhesive member 3 is decreased is different from the timing at which the surface of the scintillator 6 at a second heat peelable adhesive member 5 side reaches the temperature at which the adhesive strength of the second heat peelable adhesive member 5 is decreased. Accordingly, when the first heat peelable adhesive member 3 is heated through the substrate 2 while the second heat peelable adhesive member 5 is heated through the scintillator 6, the peeling between the substrate 2 and the imaging elements 4 and the peeling between the scintillator 6 and the imaging elements 4 can be separately performed. Even in the state in which the imaging elements 4 are peeled away from one of the substrate 2 and the scintillator 6, since the imaging elements 4 are fixed to the other one of the substrate 2 and the scintillator 6, at least one imaging element 4 can be replaced while the imaging elements 4 are placed in a mechanically stable state. This configuration is particularly preferable when at least one imaging element 4 has a defect among a plurality of imaging elements.

In addition, the case in which a-C (heat transfer quantity per unit time: 5,000 (J)) is used for the substrate 7, and a glass (heat transfer quantity per unit time: 500 (J)) is used for the substrate 2 will be described. In this embodiment, "Revalpha No. 3193MS" (trade name, manufactured by NITTO DENKO CORP) is used as the first and the second heat peelable adhesive members.

First, the radiation imaging apparatus is heated in a temperature-constant bath. In the temperature-constant bath, forces equivalent to each other are applied respectively to the scintillator 6 and the substrate 2 perpendicular to the imaging element 4 in a direction apart therefrom. The scintillator 6 having the substrate 7 formed of a-C has a heat transfer quantity per unit time larger than that of the substrate 2 formed of a glass, heat is transferred to the second heat peelable adhesive member 5 through the scintillator 6, the expansion starts at the expansion start temperature S shown in FIG. 2D, and the adhesive strength of the second heat peelable adhesive member 5 starts to decrease. Heat is further applied to the second heat peelable adhesive member 5, and the second heat peelable adhesive member 5 reaches the maximum expansion temperature M at which the adhesive strength thereof is most decreased. The adhesive strength of the second heat peelable adhesive member 5 is decreased at a temperature higher than the expansion start temperature S, and by the force applied to the scintillator 6, peeling between the scintillator 6 and the imaging elements 4 is performed. In this case, although heat is also transferred to the first heat peelable adhesive member 3 through the substrate 2, the heat transfer quantity per unit time of the substrate 2 is small as compared to the heat transfer quantity per unit time of the scintillator 6. Therefore, when the second heat peelable adhesive member 5 reaches the expansion start temperature S or the maximum expansion temperature M, the first heat peelable adhesive member 3 does not reach the expansion start temperature S or the maximum expansion temperature M, respectively. Accordingly, the adhesive strength of the first heat peelable adhesive member 3 is not so much decreased as compared to that of the second heat peelable adhesive member 5, and no peeling between the substrate 2 and the imaging elements 4 is performed. In this case, when the heat transfer quantity per unit time of the substrate 2 is assumed to be 1, the heat transfer quantity per unit time of the scintillator 6 is preferably 10 or more. The peeling as described above is preferable when the scintillator 6 has a defect.

Next, a method for manufacturing the radiation imaging apparatus 1 will be described with reference to FIGS. 3A to 3F. Hereinafter, the case in which a-C (heat transfer quantity per unit time: 5,000 (J)) is used for the substrate 7, and Al (heat transfer quantity per unit time: 118,500 (J)) is used for the substrate 2 will be described.

Figure 3A:
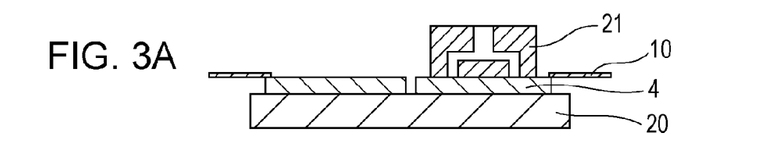
FIGS. 3A to 3F are cross-sectional views each illustrating a step of manufacturing the radiation imaging apparatus according to the first embodiment of the present invention.

First, an adsorption step shown in FIG. 3A is performed. The imaging elements 4 are adsorbed by suction to a stage 20 so that arrangement thereof is not disordered. In the adsorption step, the imaging elements 4 arranged on the stage 20 are each adsorbed by the transport device 21.

Figure 3B:
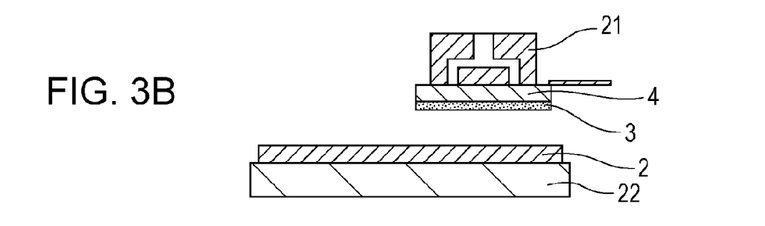

Next, a first fixing step shown in FIG. 3B is performed. The substrate 2 is placed on a stage 22. The first heat peelable adhesive member 3 is arranged on the imaging element 4 adsorbed by the transport device 21. The first heat peelable adhesive member 3 is arranged on the imaging element 4 after the separators 31 and 32 in the state shown in FIG. 2A are peeled away. The imaging element 4 is fixed to the substrate 2 with the first heat peelable adhesive member 3 provided therebetween. Although being arranged at an imaging element 4 side in this case, the first heat peelable adhesive member 3 may be arranged at a substrate 2 side. However, in the case in which a plurality of imaging elements is used, when the first heat peelable adhesive member 3 is divided and arranged to the respective imaging elements 4 at the imaging element 4 side, it is more preferable since peeling can be separately performed for each of the plurality of imaging elements 4. Incidentally, "fix (fixed)" used in this specification is not limited to the structure in which only the first heat peelable adhesive member 3 or the second heat peelable adhesive member 5 is arranged between the imaging elements 4 and the substrate 2 or the scintillator 6 so that the imaging elements 4 are adhered to the substrate 2 or the scintillator 6. Besides the structure as described above, the structure is also included in which another material is further arranged so that the imaging elements 4 are adhered to the substrate 2 or the scintillator 6 with the another material provided therebetween besides the first heat peelable adhesive member 3 or the second heat peelable adhesive member 5. This first fixing step is performed for each of the plurality of imaging elements 4, and the imaging elements 4 are fixed to the substrate 2 by the first heat peelable adhesive member 3.

Figure 3C:
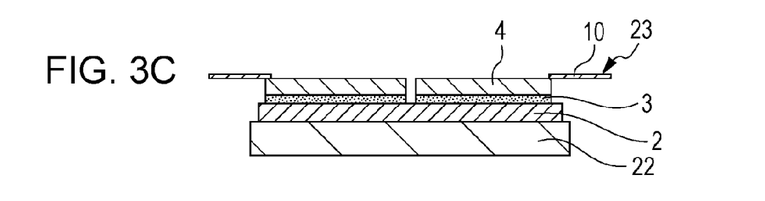

Next, a first inspection step shown in FIG. 3C is performed. In the first inspection step, the plurality of imaging elements 4 fixed to the substrate 2 is irradiated with visible light, and a signal from a probe 23 is read for inspection. In this step, when an imaging element 4 having a defect is detected, the first heat peelable adhesive member 3 is heated, and the imaging element having a defect is replaced. In this case, the "imaging element having a defect" includes an imaging element in which the operation thereof and/or an image obtained therefrom is out of the permissible range due to static electricity generated in mounting, intrusion of foreign materials, and other causes.

Figure 3D:
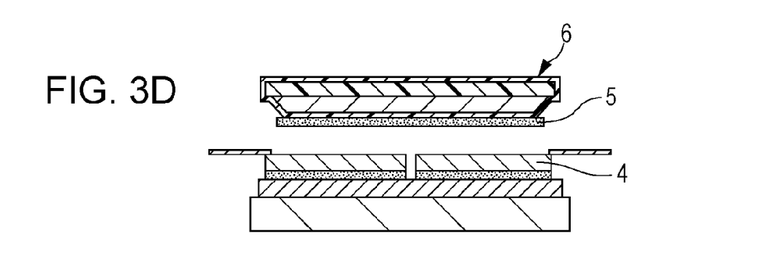

Next, a second fixing step shown in FIG. 3D is performed. The second heat peelable adhesive member 5 is arranged on the scintillator 6. The second heat peelable adhesive member 5 is arranged on the scintillator 6 after the separators 51 and 52 in the state shown in FIG. 2B are peeled away. The scintillator 6 is fixed to the plurality of imaging elements 4, which are fixed to the substrate 2, with the second heat peelable adhesive member 5 provided therebetween. Although being arranged at the scintillator 6 side in this case, the second heat peelable adhesive member 5 may be arranged at the imaging element 4 side. In particular, in the case in which a plurality of imaging elements is used, when the second heat peelable adhesive member 5 is divided and arranged to the respective imaging elements at the imaging element 4 side, it is more preferable since peeling can be separately performed for each of the plurality of imaging elements 4. Since the first heat peelable adhesive member 3 and the second heat peelable adhesive member 5 are formed using the same material, the expansion start temperature of the second heat peelable adhesive member 5 is the same as the expansion start temperature of the first heat peelable adhesive member 3.

Figure 3E:
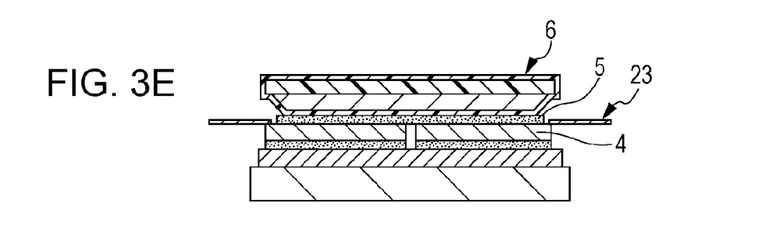

Next, a second inspection step shown in FIG. 3E is performed. In the second inspection step, while the substrate 2, the plurality of imaging elements 4, and the scintillator 6 are fixed together, the scintillator 6 is irradiated with radiation, and a signal from the probe 23 is read for inspection. At this stage, the presence of an imaging element 4 having a defect is checked, and when the presence thereof is confirmed, in order to replace this imaging element 4, peeling is performed between the substrate 2 and the imaging elements 4. Furthermore, the scintillator 6 is also inspected. When it is judged that the image quality is adversely influenced by a defect of the scintillator 6, in order to replace the scintillator 6, peeling is performed between the imaging elements 4 and the scintillator 6. Steps of performing peeling between the imaging elements 4 and the substrate 2 or the scintillator 6 will be described later with reference to FIGS. 4A to 4C or 5A to 5C, respectively.

Figure 3F:
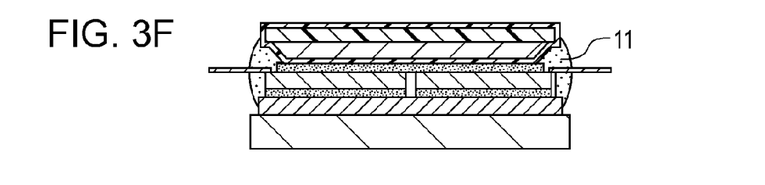

When no defects of the imaging elements 4 and the scintillator 6 are confirmed in the second inspection step, a sealing step shown in FIG. 3F is performed. In this sealing step, the peripheries of the imaging elements 4 are at least sealed with the sealing member 11. Since being fixed by the sealing member 11 in this sealing step, the wiring board 10 is placed in the state so as to penetrate the sealing member 11. By the sealing with the resin 11, the structure in which the substrate 2 and the scintillator 6 are not easily peeled away from the imaging elements 4 is formed, so that the strength of the radiation imaging apparatus 1 is improved. In addition, the structure is formed in which moisture and/or impurities intruding into the scintillator 6, the imaging elements 4, and the individual interfaces from the outside can be suppressed, and hence the reliability of the radiation imaging apparatus 1 is improved.

Figure 4A:
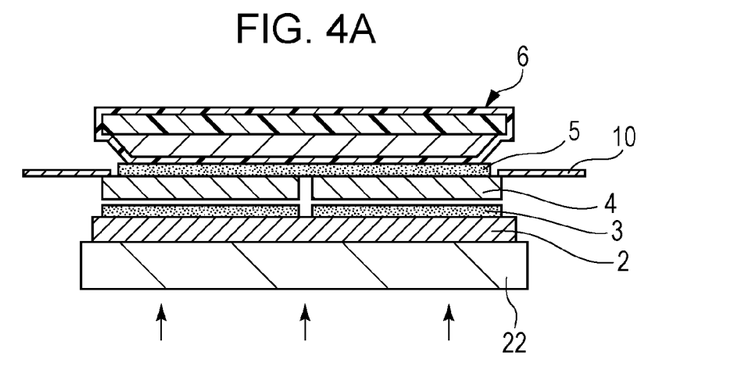
FIGS. 4A to 4C are cross-sectional views each illustrating a step of peeling a substrate according to the first embodiment of the present invention.
Figure 4B:
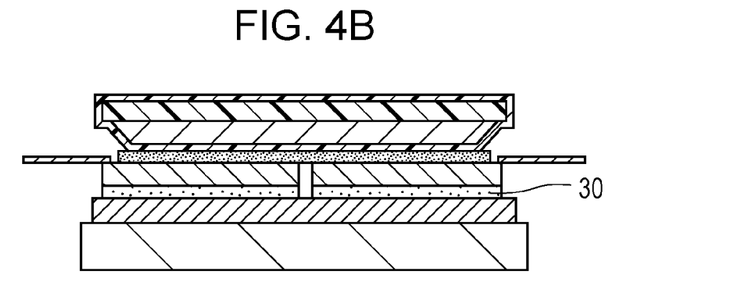
Figure 4C:
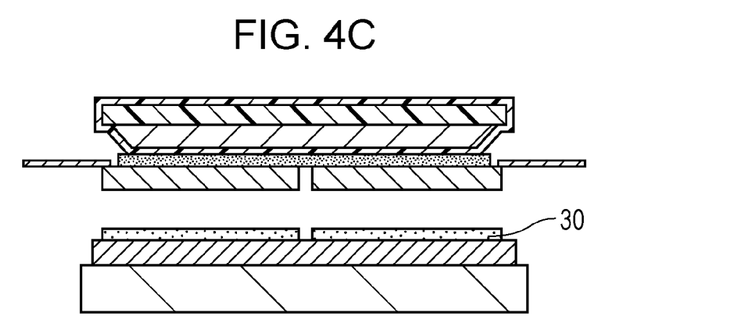

Next, the steps of peeling the imaging elements 4 from the substrate 2 will be described with reference to FIGS. 4A to 4C. Hereinafter, the case in which at least one of the imaging elements 4 has a defect will be described. First, as shown in FIG. 4A, the radiation imaging apparatus is heated in a temperature-constant bath. In the temperature-constant bath, forces equivalent to each other are applied respectively to the scintillator 6 and the substrate 2 perpendicular to the imaging element 4 in a direction apart therefrom. Heat is applied to the first heat peelable adhesive member 3 through the substrate 2, and the expansion starts at the expansion start temperature shown in FIG. 2D, so that the adhesive strength of the first heat peelable adhesive member 3 starts to decrease. Heat is further applied to the first heat peelable adhesive member 3, and the first heat peelable adhesive member 3 reaches the maximum expansion temperature M at which the adhesive strength thereof is most decreased, so that as shown in FIG. 4B, the first heat peelable adhesive member 3 is changed into the heat peelable adhesive member 30 having a decreased adhesive strength. The adhesive strength of the first heat peelable adhesive member 3 is decreased at a temperature higher than the expansion start temperature S, and by the force applied to the substrate 2, peeling between the substrate 2 and the imaging elements 4 is performed. In this case, although heat is also transferred to the second heat peelable adhesive member 5 through the scintillator 6, the heat transfer quantity per unit time of the scintillator 6 is small as compared to the heat transfer quantity per unit time of the substrate 2. Therefore, when the first heat peelable adhesive member 3 reaches the expansion start temperature S or the maximum expansion temperature M, the second heat peelable adhesive member 5 does not reach the expansion start temperature S or the maximum expansion temperature M, respectively. Accordingly, the adhesive strength of the second heat peelable adhesive member 5 is not so much decreased as compared to that of the first heat peelable adhesive member 3, and no peeling between the scintillator 6 and the imaging elements 4 is performed.

Figure 5A:
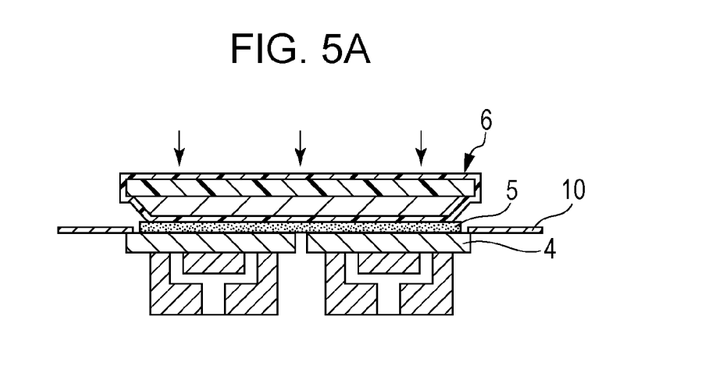
FIGS. 5A to 5C are cross-sectional views each illustrating a step of peeling a scintillator according to the first embodiment of the present invention.
Figure 5B:
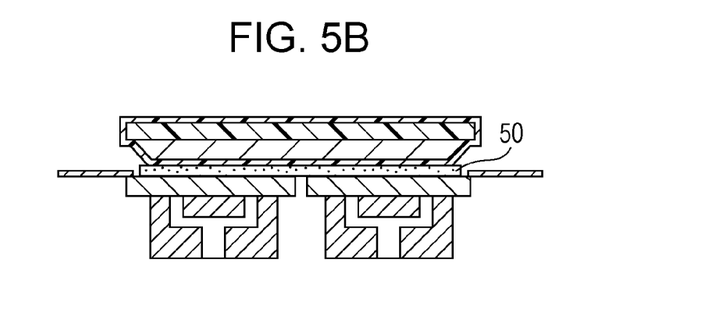
Figure 5C:
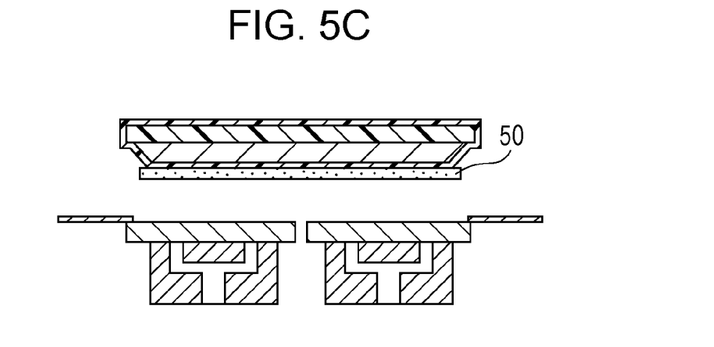

Next, the steps of peeling the imaging elements 4 from the scintillator 6 will be described with reference to FIGS. 5A to 5C. First, as shown in FIG. 5A, in this peeling, the imaging elements 4 are fixed by the respective transport devices 21 and are heated from the scintillator 6 side. In this case, infrared radiation is performed from the scintillator 6 side. Heat is transferred to the second heat peelable adhesive member 5 through the scintillator 6, and the expansion starts at the expansion start temperature S shown in FIG. 2D. Heat is further applied to the second heat peelable adhesive member 5, and the second heat peelable adhesive member 5 reaches the maximum expansion temperature M at which the adhesive strength thereof is most decreased. At this stage, the second heat peelable adhesive member 5 is changed into a heat peelable adhesive member 50 having a decreased adhesive strength. The adhesive strength of the second heat peelable adhesive member 5 is decreased at a temperature higher than the expansion start temperature S, and by the force applied to the scintillator 6, the peeling is performed between the scintillator 6 and the imaging elements 4. In this case, although the peeling is described which is performed by heating from the scintillator 6 side using infrared radiation, the present invention is not limited thereto. Heating may be continuously performed by the temperature-constant bath which is previously used so that the peeling between the scintillator 6 and the imaging elements 4 is performed.

As described above, according to the present invention, in the radiation imaging apparatus in which the imaging elements 4 are provided between the scintillator 6 and the substrate 2, at least one of the imaging elements 4 or the scintillator 6 can be peeled away in the state in which the imaging elements 4 are mechanically stable. In addition, when an adhesive containing thermally expandable particles is used as the heat peelable adhesive member, since the amount of residues of the adhesive remaining on the surface of the substrate from which the imaging element 4 is removed is small, a new imaging element can be easily fixed to the substrate.

Second Embodiment

Figure 6A:
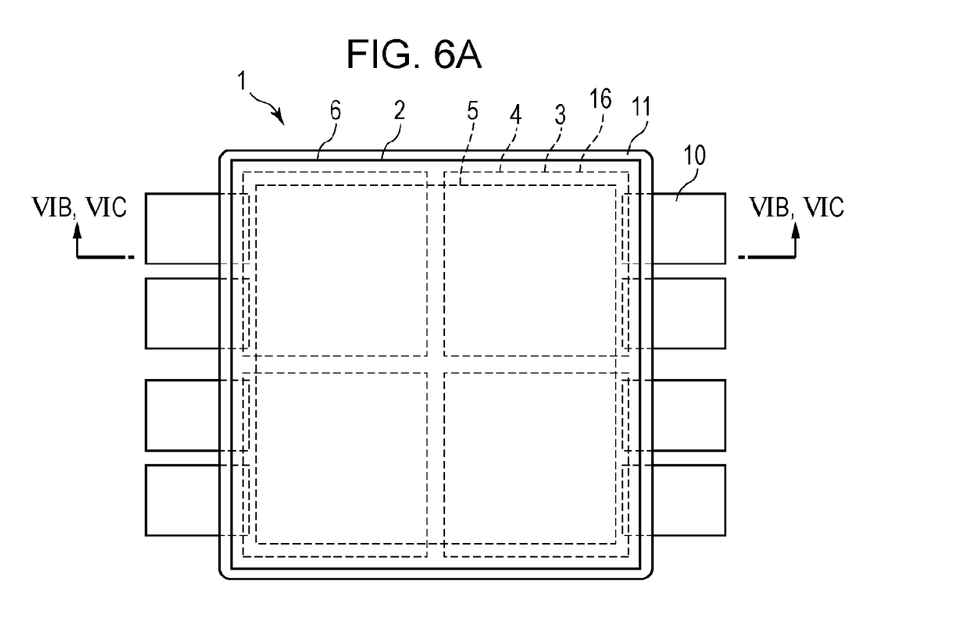
FIG. 6A is a plan view of a radiation imaging apparatus according to a second embodiment of the present invention.
Figure 6B:
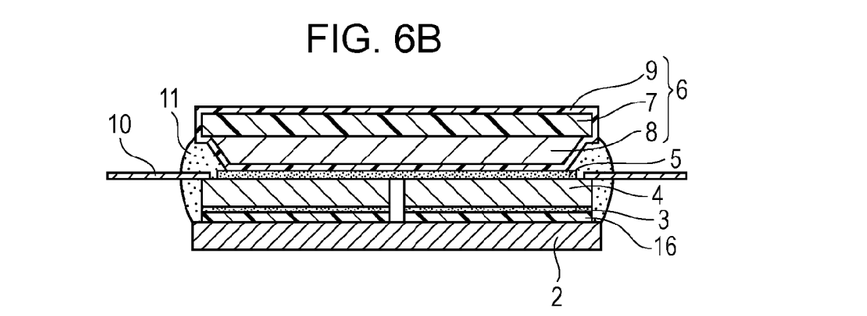
FIG. 6B is a cross-sectional view of the radiation imaging apparatus taken along the line VIB-VIB of FIG. 6A.
Figure 6C:
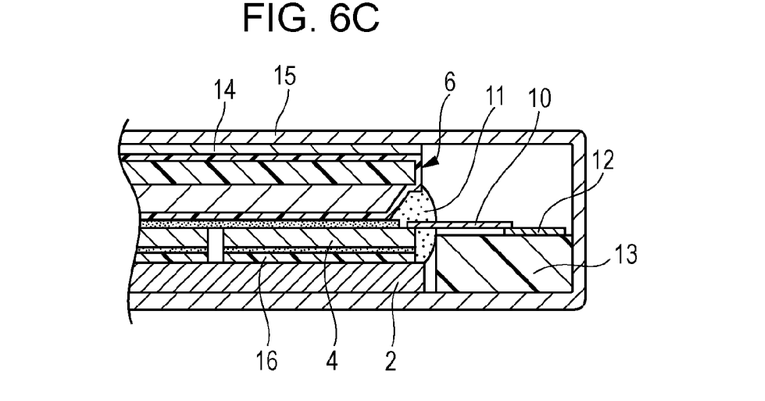
FIG. 6C is a partially enlarged cross-sectional view of the radiation imaging apparatus taken along the line VIC-VIC of FIG. 6A.

Next, a radiation imaging apparatus according to a second embodiment will be described with reference to FIGS. 6A to 6C. The same elements as those of the first embodiment are designated by the same reference numerals thereof, and detailed descriptions of the same element and the same step will be omitted. FIG. 6A is a plan view of primary constituent elements of the radiation imaging apparatus according to the second embodiment of the present invention, FIG. 6B is a cross-sectional view of the radiation imaging apparatus taken along the line VIB-VIB of FIG. 6A, and FIG. 6C is a partially enlarged cross-sectional view of the radiation imaging apparatus taken along the line VIC-VIC shown in FIG. 6A.

A portion of this embodiment different from that of the first embodiment is a resin layer 16 controlling the heat transfer quantity provided between the first heat peelable adhesive member 3 and the substrate 2. This resin layer 16 can be regarded as the surface of the substrate 2 for controlling the heat transfer quantity, that is, the substrate 2 and the resin layer 16 can be collectively regarded as the substrate. In this case, a paint or a sheet material, each of which absorbs heat, is used for the resin layer 16. As a material of the paint absorbing heat, a material having a high heat conductivity is preferable, and a material, such as a carbon nanotube or a metal, having a heat conductivity of 15 (W/(m·k)) or more is preferable. This material having a high heat conductivity is dispersed in a polymer, such as an acrylic resin, an epoxy resin, or a silicone resin, and is applied to the surfaces of the imaging elements 4 at the substrate 2 side, for example, by screen printing, followed by performing drying. As the sheet material absorbing heat, for example, a high performance silicone gel sheet or a high heat conductive silicone rubber sheet may be used. In this case, the sheet material absorbing heat preferably has an adhesion function on its surface at the imaging element 4 side. In addition, for this resin layer 16, a paint or a sheet material, each of which has heat insulating properties, may also be used. As the material having heat insulating properties, a material having a low heat conductivity is preferable, and a polymer material, such as an acrylic resin, an epoxy resin, and a silicone resin, having a heat conductivity of 0.2 (W/(m·k)) or less is preferable. As the sheet material having heat insulating properties, a material, such as a polyolefinic resin sheet, an acrylic sheet, a rubber sheet, or a nylon sheet, having a heat conductivity of 0.2 (W/(m·k)) or less may be used. In this case, the sheet material having heat insulating properties preferably has an adhesion function on its surface at the imaging element 4 side.

Accordingly, since the difference in heat transfer quantity per unit time between the substrate 2 and the scintillator 6 can be further increased, the peeling by the first heat peelable adhesive member 3 and the peeling by the second heat peelable adhesive member 5 can be separately and reliably performed.

Figure 7A:
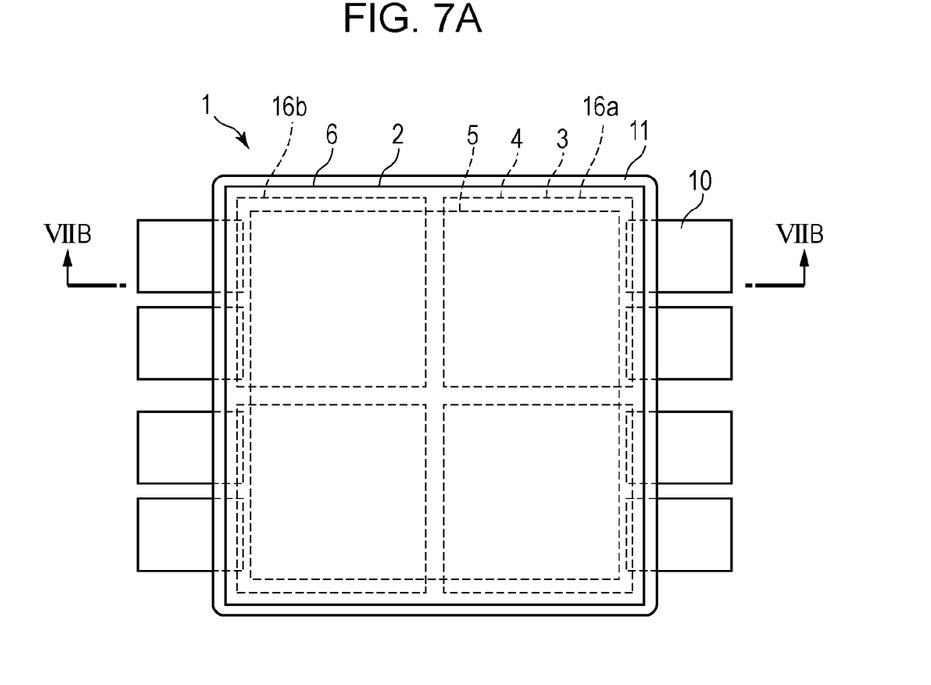
FIG. 7A is a plan view of another example of the radiation imaging apparatus according to the second embodiment of the present invention.
Figure 7B:
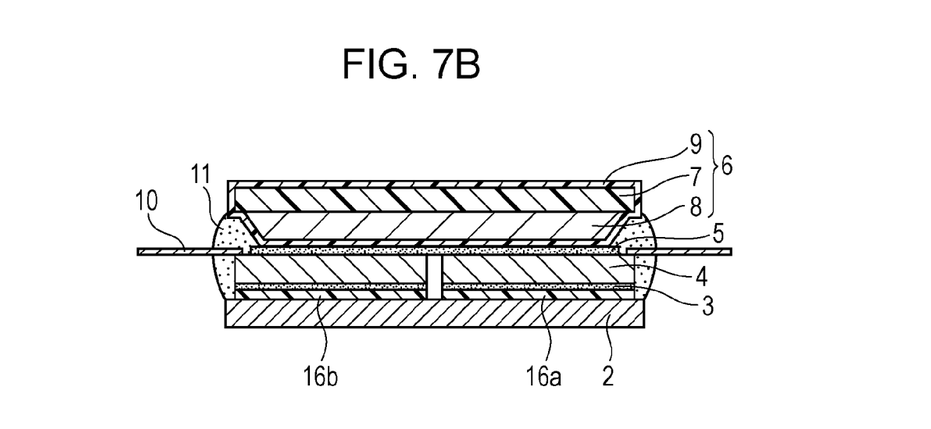
FIG. 7B is a cross-sectional view of the radiation imaging apparatus taken along the line VIIB-VIIB of FIG. 7A.

In addition, the heat transfer quantity per unit time of the resin layer 16 is controlled to a desired value by controlling the contact area between the application area and the substrate 2. In addition, as shown in FIGS. 7A and 7B, the resin layer 16 is divided into resin layers 16a and 16b and is provided to the respective imaging elements 4. The resin layers 16a and 16b are arranged so that the heat transfer quantity between the substrate 2 and a predetermined imaging element 4 of the imaging elements 4 is different from that between a different imaging element 4 thereof and the substrate 2. By the structure formed as described above, the imaging elements 4 can be peeled away from the substrate 2 in a desired order and can be safely and efficiently peeled away from the substrate 2. In the case as described above, a plurality of the first heat peelable adhesive members 3 is preferably provided on the respective imaging elements 4. FIG. 7A is a plan view of primary constituent elements of another example of the radiation imaging apparatus according to the second embodiment, and FIG. 7B is a cross-sectional view of the radiation imaging apparatus taken along the line VIIB-VIIB of FIG. 7A.

Third Embodiment

Figure 8:
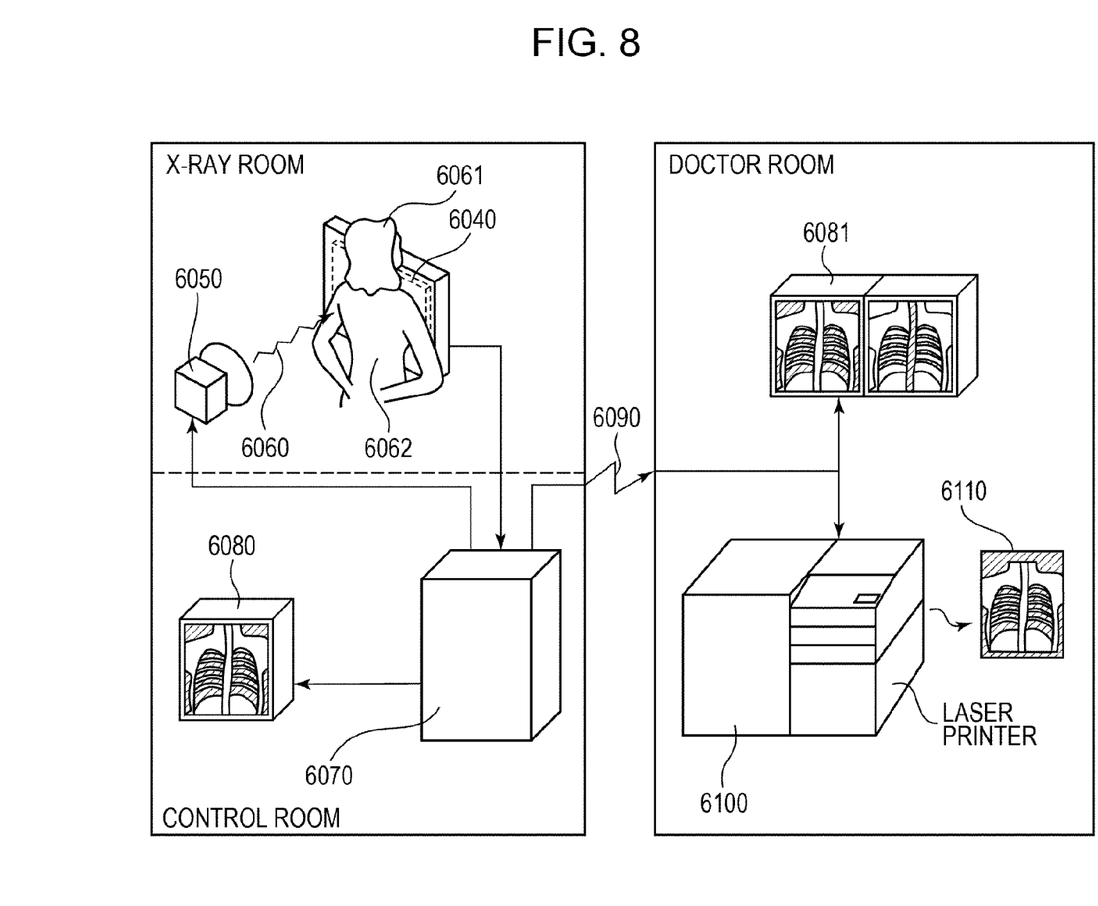
FIG. 8 is a view showing an example of application of the radiation imaging apparatus of the present invention to a radiation imaging system.

An example of application of the radiation imaging apparatus of the present invention to a radiation imaging system will be described with reference to FIG. 8. X-rays 6060 generated from an X-ray tube (radiation source) 6050 pass through a chest 6062 of a patient or a subject 6061 and enter a radiation imaging apparatus 6040 of the present invention including the scintillator 6 and the imaging elements 4. The incident X-rays include in-vivo information of the patient 6061. The scintillator 6 emits light in response to the incident X-rays, and electrical information is obtained by photoelectric conversion of this light. This information is converted into digital signals and is then image-processed by an image processor 6070 functioning as a signal processing device, so that an image can be observed on a display 6080 functioning as a display device in a control room. In addition, the radiation imaging system has at least a radiation imaging apparatus and a signal processing device which processes a signal transferred therefrom.

In addition, this information can be transferred to a remote place through a transmission device, such as a telephone line 6090, and can be displayed on a display 6081 functioning as a display device or stored in a recording device, such as an optical disk, in a doctor room apart from the control room, so that a doctor located at a remote place is able to diagnose the information. The information may also be recorded on a film 6110 functioning as a recording medium by a film processor 6100 functioning as a recording device. In addition, the information can also be printed on paper by a laser printer functioning as a recording device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-004650 filed Jan. 13, 2011, which is hereby incorporated by reference herein in its entirety.

What is claimed is:

1. A radiation imaging apparatus comprising:
   a substrate;
   at least one imaging element;
   a scintillator;
   at least one first heat peelable adhesive member which fixes the substrate to the imaging element, an adhesive strength of the first heat peelable adhesive member being decreased by heat; and
   a second heat peelable adhesive member which fixes the imaging element to the scintillator, an adhesive strength of the second heat peelable adhesive member being decreased by heat wherein a temperature of the first heat peelable adhesive member at which the adhesive strength is decreased is substantially equal to a temperature of the second heat peelable adhesive member at which the adhesive strength is decreased, and wherein a heat transfer quantity per unit time of the substrate is different from a heat transfer quantity per unit time of the scintillator.

2. The radiation imaging apparatus according to claim 1, wherein the first heat peelable adhesive member and the second heat peelable adhesive member each have an adhesive and a foaming agent blended therewith.

3. The radiation imaging apparatus according to claim 1, wherein, when the heat transfer quantity per unit time of the substrate is 1, the heat transfer quantity per unit time of the scintillator is equal to or lower than $1/10$ or equal to or greater than 10.

4. The radiation imaging apparatus according to claim 1, wherein the substrate has a resin layer to control the heat transfer quantity, and the resin layer forms the surface of the substrate which is in contact with the imaging element.

5. The radiation imaging apparatus according to claim 4, wherein the imaging elements are fixed to the substrate with the first heat peelable adhesive member, the resin layer is divided into resin sublayers which are provided to the respective imaging elements, and the heat transfer quantity between a predetermined imaging element among the imaging elements and a resin sublayer corresponding to the predetermined imaging element is different from the heat transfer quantity between an imaging element different from the predetermined imaging element and a resin sublayer corresponding to the different imaging element.

6. The radiation imaging apparatus according to claim 5, wherein a contact area between the predetermined imaging element and the resin sublayer corresponding thereto is different from a contact area between the different imaging element and the resin sublayer corresponding thereto.

7. The radiation imaging apparatus according to claim 5, wherein the first heat peelable adhesive members are provided to the respective imaging elements.

8. The radiation imaging apparatus according to claim 1, wherein the second heat peelable adhesive member has optical transparency which transmits light from the scintillator.

9. A radiation imaging system comprising:
the radiation imaging apparatus according to claim 1; and
an image processing device which processes a signal therefrom.

10. A method for manufacturing a radiation imaging apparatus comprising the steps of:

fixing an imaging element to a substrate with a first heat peelable adhesive member, the first heat peelable adhesive member having an adhesive strength which is decreased by heat, and fixing the imaging element to a scintillator with a second heat peelable adhesive member, wherein a heat transfer quantity per unit time of the substrate is different from a heat transfer quantity per unit time of the scintillator, and wherein a temperature of the first heat peelable adhesive member at which the adhesive strength is decreased is substantially equal to a temperature of the second heat peelable adhesive member at which the adhesive strength is decreased; and inspecting the imaging element fixed to the substrate and the scintillator to determine whether the imaging element is defective, wherein, when the imaging element is determined to be defective by inspection in the inspection step, the first heat peelable adhesive member is heated through the substrate and the second heat peelable adhesive member is heated through the scintillator so that the imaging element and one of the substrate and the scintillator, whichever has a larger heat transfer quantity per unit time, are peeled away from each other and so that the imaging element and the other one of the substrate and the scintillator are not peeled away from each other.

* * * * *